(12) United States Patent
Zhu et al.

(10) Patent No.: US 8,004,881 B2
(45) Date of Patent: Aug. 23, 2011

(54) MAGNETIC TUNNEL JUNCTION DEVICE WITH SEPARATE READ AND WRITE PATHS

(75) Inventors: Xiaochun Zhu, San Diego, CA (US); Shiqun Gu, San Diego, CA (US); Xia Li, San Diego, CA (US); Seung H. Kang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 477 days.

(21) Appl. No.: 11/959,797

(22) Filed: Dec. 19, 2007

(65) Prior Publication Data

US 2009/0161422 A1    Jun. 25, 2009

(51) Int. Cl.
*G11C 11/00* (2006.01)
(52) U.S. Cl. ..... 365/158; 365/148; 365/171; 365/225.5; 365/243.5; 977/933; 977/935
(58) Field of Classification Search ............... 365/8, 55, 365/62, 66, 74, 78, 80–93, 100, 130, 131, 365/148, 158, 171–173, 225.5, 243.5; 216/22; 257/421, E21.665; 438/3; 977/933–935
See application file for complete search history.

(56) References Cited

U.S. PATENT DOCUMENTS

| | | | |
|---|---|---|---|
| 6,072,718 A | 6/2000 | Abraham et al. | |
| 6,479,848 B2 * | 11/2002 | Park et al. | 257/295 |
| 7,009,877 B1 * | 3/2006 | Huai et al. | 365/171 |
| 7,109,539 B2 | 9/2006 | Lu | |
| 7,285,836 B2 | 10/2007 | Ju et al. | |
| 7,471,551 B2 | 12/2008 | Oikawa | |
| 2002/0122338 A1 * | 9/2002 | Park et al. | 365/200 |
| 2004/0100855 A1 * | 5/2004 | Saito et al. | 365/232 |
| 2004/0246776 A1 * | 12/2004 | Covington | 365/173 |
| 2005/0201023 A1 | 9/2005 | Huai et al. | |
| 2007/0063237 A1 * | 3/2007 | Huai et al. | 257/295 |
| 2008/0061388 A1 * | 3/2008 | Diao et al. | 257/421 |
| 2008/0225583 A1 * | 9/2008 | Guo et al. | 365/173 |

FOREIGN PATENT DOCUMENTS

WO    2004038723    5/2004

OTHER PUBLICATIONS

International Search Report-PCT/US08/087748, International Search Authority-European Patent Office Mar. 4, 2009.
Written Opinion-PCT/US08/087748, International Search Authority-European Patent Office Mar. 4, 2009.

* cited by examiner

*Primary Examiner* — Richard Elms
*Assistant Examiner* — Harry W Byrne
(74) *Attorney, Agent, or Firm* — Semion Talpalatsky

(57) ABSTRACT

In an embodiment, a device is disclosed that includes a magnetic tunnel junction (MTJ) structure. The device also includes a read path coupled to the MTJ structure and a write path coupled to the MTJ structure. The write path is separate from the read path.

10 Claims, 14 Drawing Sheets

MAGNETIC TUNNEL JUNCTION DEVICE WITH SEPARATE READ AND WRITE PATHS

I. FIELD OF THE DISCLOSURE

The present disclosure is generally directed to a device including a magnetic tunnel junction (MTJ) structure that has separate read and write data paths.

II. BACKGROUND

Conventional Spin Transfer Torque Magnetic Random Access Memory (STT-MRAM) bit cells include a transistor and a magnetic tunnel junction (MTJ) structure. The basic MTJ structure consists of two magnetic electrodes sandwiching an oxide tunnel barrier layer. The magnetic moment of each magnetic electrode is oriented along a long axis of a laterally elongated element. The parallel and anti-parallel magnetic moment orientation between the two magnetic layers on either side of the tunnel barrier gives rise to two different resistances across the barrier, resulting in two memory states. One of the magnetic electrodes, referred to as the free layer, has a magnetic moment direction that can be switched. The other magnetic electrode, referred to as a reference layer, has a magnetization that is pinned to a particular direction.

In conventional STT-MRAM structures, an injected current becomes spin polarized due to fixed magnetization in the reference layer, resulting in a spin transfer torque (STT) at the magnetization of the free layer. When the current density of the injected current exceeds a threshold, the magnetization orientation of the free layer can be switched by the spin transfer torque. The resulting memory state (i.e., 0 or 1) is determined by the direction of the current.

Conventionally, both a read process and a write process are operated by use of current injection. For the write process, the current density allowed to flow through the MTJ device in an STT-MRAM bit cell has a strong dependence on the MTJ resistance, such that when the MTJ resistance is lower, more current is allowed to pass through the MTJ device. Therefore, a smaller MTJ resistance provides a larger data writing operation margin for MRAM designers. However, the smaller MTJ resistance also results in smaller data read sensing margins. Likewise, a larger MTJ resistance that improves data read sensing margins impairs data writing operation margins. As a result, the MTJ resistance of conventional MTJ designs represents a design compromise between improving data read sensing margins and improving data writing operation margins.

Further, dual MTJ STT-MRAM cell designs have been proposed to increase write capability of the MTJ cell. However, the dual MTJ designs place even further limitations on MTJ resistance and a greater sensitivity to data read sensing margins.

III. SUMMARY

In a particular embodiment, a device is disclosed that includes a magnetic tunnel junction (MTJ) structure. The device also includes a read path coupled to the MTJ structure and a write path coupled to the MTJ structure. The write path is separate from the read path.

In another embodiment, a method of writing to a magnetic tunnel junction device is disclosed. The method includes applying a current to a write path coupled to a magnetic tunnel junction (MTJ) device to store a data value at a free layer of the MTJ device. The MTJ device is coupled to a separate read path.

In another embodiment, a method of reading data from an MTJ device is disclosed. The method includes applying a current to a read path coupled to the MTJ device to read a data value. The MTJ device is coupled to a separate write path.

In another embodiment, a memory device is disclosed. The memory device includes an array of magnetic random access memory (MRAM) cells. The memory device also includes a memory control logic circuit adapted to activate a word line and to selectively activate either a read bit line or a write bit line to access a selected cell of the memory array.

In another embodiment, a method of fabricating a magnetic tunnel junction (MTJ) device is disclosed. The method includes depositing a plurality of film layers onto a substrate to form a first MTJ structure. The first MTJ structure includes a free layer. The method includes depositing a conductive layer coupled to the free layer of the first MTJ structure. The method also includes depositing a second plurality of film layers to form a second MTJ structure on the first MTJ structure.

One particular advantage provided by the disclosed embodiments is that both reading and writing margins may be improved at an STT-MRAM device.

Another advantage provided by the disclosed embodiments is a reduced write current required to store a data value at an STT-MRAM device.

Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Figure 1:
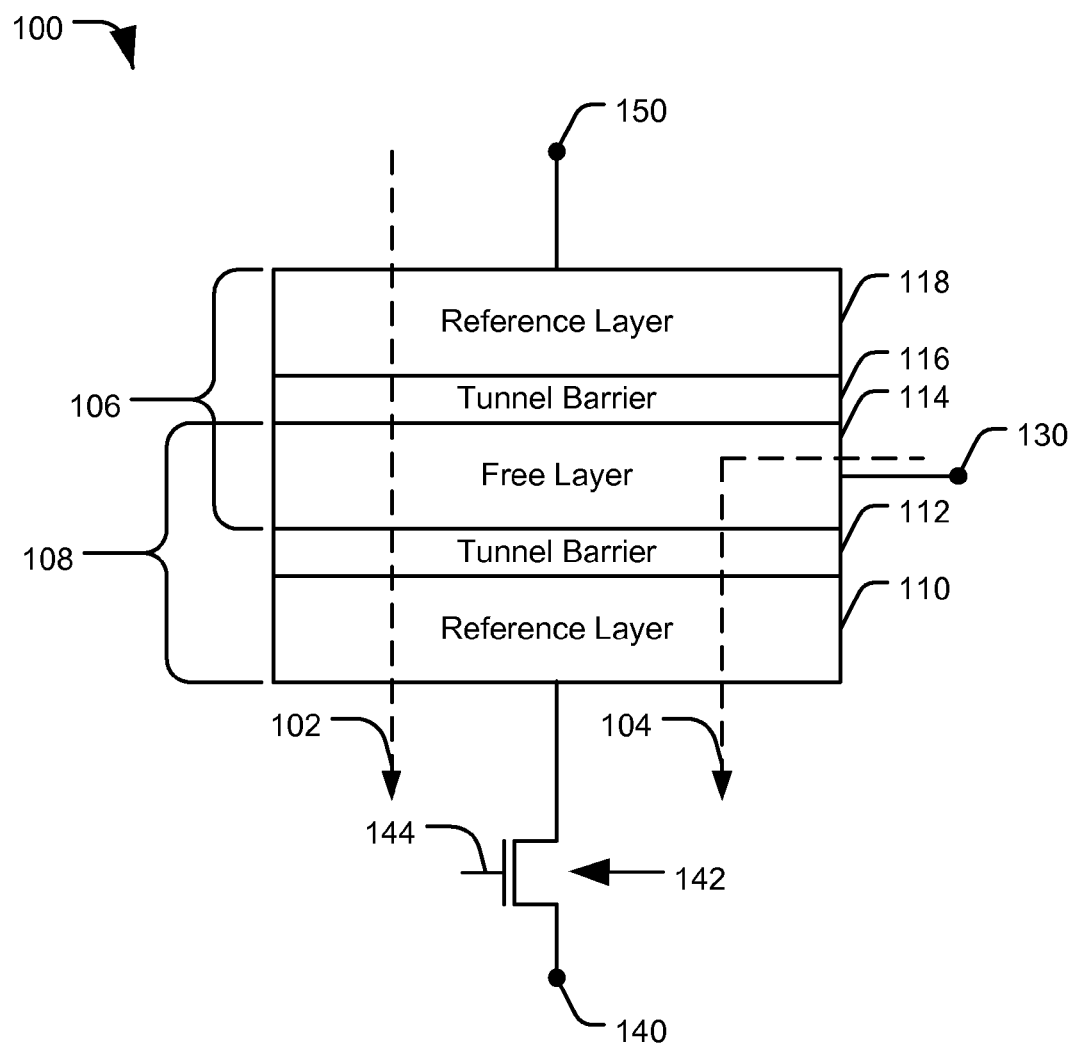
FIG. 1 is a diagram of a particular illustrative embodiment of a magnetic tunnel junction (MTJ) device with separate data read and write paths.

Referring to FIG. 1, a diagram of a particular illustrative embodiment of a magnetic tunnel junction (MTJ) device with separate data read and write paths is depicted and generally designated 100. In a particular embodiment, the device 100 may be included in a STT-MRAM bit cell. A data read path 102 and a data write path 104 provide separate current paths coupled to a MTJ structure of the device 100. A first reference layer 110, a tunnel barrier layer 112, and a free layer 114 form a first MTJ component 108. The free layer 114, a second tunnel barrier layer 116, and a second reference layer 118 form a second MTJ component 106. A write terminal 130 is coupled to the free layer 114. A read terminal 150 is coupled to the second reference layer 118. A switch 142, such as a transistor, is coupled between the first reference layer 110 and a source terminal 140. The switch 142 is coupled to receive a control signal 144. In a particular embodiment, the device 100 may be part of an array of Magnetic Random Access Memory (MRAM) devices.

In a particular embodiment, the data read path 102 includes the read terminal 150, the second MTJ component 106, the first MTJ component 108, the switch 142, and the source terminal 140. The magnetic moments of the first reference layer 110 and the second reference layer 118 are pinned in a same direction, and the magnetic moment of the free layer 114 may be set in a direction parallel or antiparallel to the reference layers 110 and 118.

Resistance to current along the data read path 102 arises due resistance across the second tunnel barrier 116 between the second reference layer 118 and the free layer 114, and also due to resistance across the first tunnel barrier 112 between the free layer 114 and the first reference layer 110. Because a resistance of the device 100 corresponds to a data value stored at the device 100, the stored data value may be determined by providing a read signal and comparing an output to a reference signal. For example, the read signal may be a voltage applied between the read terminal 150 and the source terminal 140, and the resultant current along the data read path 102 may be compared to a reference current. As another example, the read signal may be a current provided along the data read path 102, and the resultant voltage between the read terminal 150 and the source terminal 140 may be compared to a reference voltage.

Current along the data write path 104 encounters resistance across the first tunnel barrier 112 but not across the second tunnel barrier 116. Thus, the data write path 104 has a lower resistance than the data read path 102. In a particular embodiment, the second reference layer 118 and the second tunnel barrier 116 may also be configured to have a higher resistance than the first reference layer 110 and the first tunnel barrier 112 to further increase a difference in resistance along the data read path 102 as compared to the data write path 104.

A read current along the data read path 102 therefore encounters a higher tunneling magneto-resistance and improved read margin, and a write current along the data write path 104 encounters a lower tunneling magneto-resistance and improved write margin, than would be achievable using a single path for both reading and writing data. In addition, reduced resistance in the data write path 104 enables smaller write bias voltage, smaller device features, higher densities, and lower power consumption.

Figure 2:
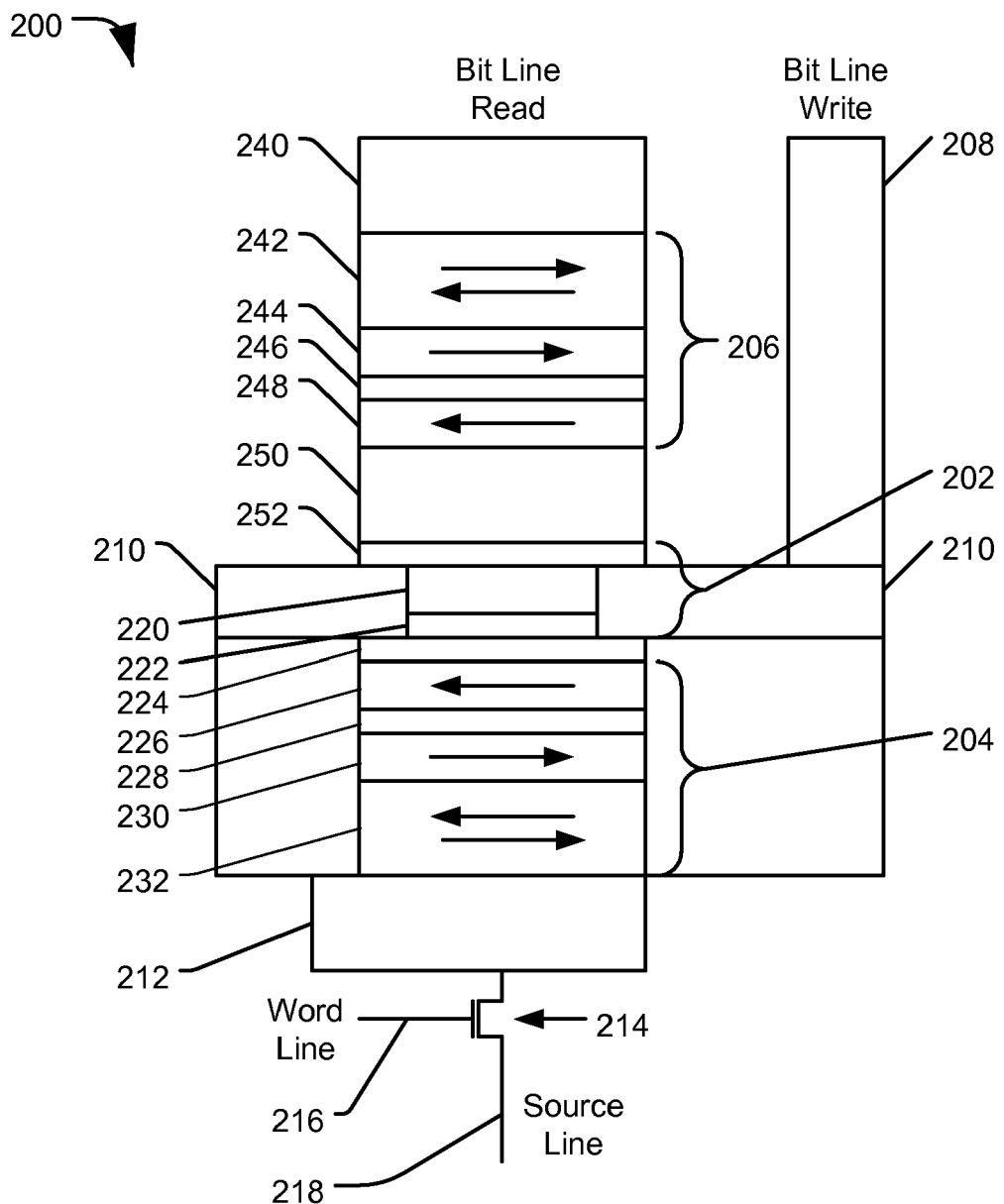
FIG. 2 is a diagram of a second illustrative embodiment of a magnetic tunnel junction (MTJ) device with separate data read and write paths.

Referring to FIG. 2, a diagram of a second illustrative embodiment of a magnetic tunnel junction (MTJ) device with separate data read and write paths is depicted and generally designated 200. In a particular embodiment, the device 200 may be included in a STT-MRAM bit cell. In a particular embodiment, the device 200 operates substantially similarly to the device 100 illustrated in FIG. 1. A free layer 202 is sandwiched between and magnetically coupled to a first reference layer 204 and a second reference layer 206. A write bit line terminal 208 is coupled to a conductive layer 210 that abuts the free layer 202. A bottom conductor 212 is coupled to the first reference layer 204 and is coupled to a switch 214. The switch 214 is coupled to receive one or more control signals, such as a word line control signal 216 and a source line control signal 218. A data write path includes the write bit line terminal 208, the conductive layer 210, the free layer 202, the first reference layer 204, the bottom conductor 212, and the switch 214. A data read path includes a bit line read conductor 240, the second reference layer 206, the free layer 202, the first reference layer 204, the bottom conductor 212, and the switch 214.

The free layer 202 includes at least two free layer portions 220 and 222 in both the data write path and the data read path. The free layer 202 also includes a free layer portion 252 in the data read path. Materials in the free layer portions 220, 222, and 252 may depend on materials of adjacent layers. For example, from bottom to top, the free layer portions 220, 222, and 252 may include CoFeB/NiFe/CoFeB or CoFeB or CoFe/CoFeB or NiFe/CoFeB or CoFe/NiFe/CoFeB. In a particular embodiment, the conductive layer 210 that abuts the free layer 202 and the write bit line terminal 208 includes a conductive material, such as Ta, Ru, Cu, Mg, Al, Ti, Au, or any combination thereof. In a particular embodiment, a shape, size, and material composition of the free layer portions 220, 222, and 252 can be different from each other. In another embodiment, the free layer 202 may include only one or two of the free layer portions 220, 222, and 252.

A first interlayer 224 is positioned between the free layer 202 and the first reference layer 204. In a particular embodiment, to increase write current, the free layer 202 interfacing with the first reference layer 204 can be either a current-perpendicular-to-plane (CPP) giant magnetoresistance (GMR) or a tunneling magnetoresistance (TMR) structure with a very thin MgO barrier. In a particular embodiment, the first interlayer 224 includes an oxidation tunneling barrier, such as MgO or AlOx. In another embodiment, the first interlayer 224 includes a conductive layer, such as Ru, Cu, or Cr.

In a particular embodiment, the first reference layer 204 includes a synthetic antiferromagnet (SAF) structure formed with a CoFeB layer 226, a Ru layer 228, and a CoFe layer 230. The direction of the magnetic field of the SAF structure is pinned by an antiferromagnetic (AFM) layer 232. The AFM layer 232 is coupled to the bottom conductor 212. In an alternative embodiment, the AFM layer 232 may be coupled to a seed layer or a substrate layer.

In a particular embodiment, the bit line read conductor 240 is a top conductor that also functions as a capping layer of the device 200. In a particular embodiment, the bit line read conductor 240 primarily includes a conductive material, such as Ru, Ta, Cu, Au, or any combination thereof. The second reference layer 206 includes an AFM layer 242 coupled to the bit line read conductor 240. The AFM layer 242 pins a magnetic field direction of a second SAF structure that includes, in a particular embodiment, a CoFe layer 244, a Ru layer 246, and a CoFeB layer 248. The pinned magnetic field of the first reference layer 204 is parallel to the pinned magnetic field of the second reference layer 206.

A second interlayer 250 is positioned between the second reference layer 206 and the free layer 202. In a particular embodiment, the second interlayer 250 is an MgO or AlOx layer providing TMR along the data read path. Resistance across the second interlayer 250 may increase with increased thickness of the second interlayer 250. In a particular embodiment, the second interlayer 250 may be significantly thicker than the first interlayer 224.

Figure 3:
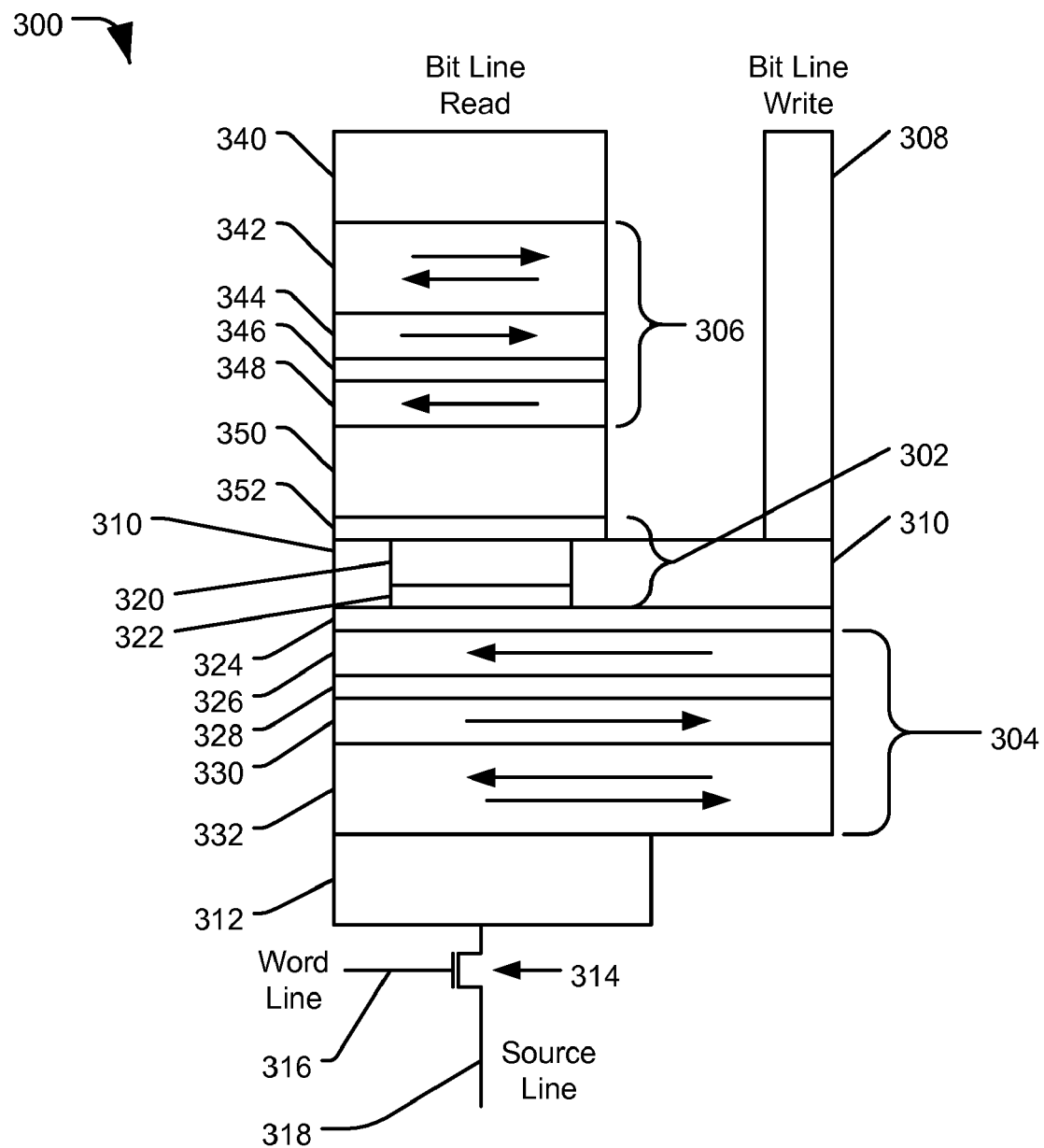
FIG. 3 is a diagram of a third illustrative embodiment of a magnetic tunnel junction (MTJ) device with separate data read and write paths.

Referring to FIG. 3, a diagram of a third illustrative embodiment of a magnetic tunnel junction (MTJ) device with separate data read and write paths is depicted and generally designated 300. In a particular embodiment, the device 300 may be included in a STT-MRAM bit cell. In a particular embodiment, the device 300 operates substantially similarly to the device 100 illustrated in FIG. 1. A free layer 302 is sandwiched between and magnetically coupled to a first reference layer 304 and a second reference layer 306. Properties of the device 300 such as current path and resistance are primarily determined by the area of the free layer 302, and not by the first reference layer 304 and the second reference layer 306. Thus, the shape and size of the first reference layer 304, the second reference layer 306, and the free layer 302 may be adjusted according to design and fabrication requirements. As illustrated in FIG. 3, the first reference layer 304 may extend substantially over the width of the device 300.

A write bit line terminal 308 is coupled to a conductive layer 310 that abuts the free layer 302. A bottom conductor 312 is coupled to the first reference layer 304 and is coupled to a switch 314. The switch 314 is coupled to receive one or more control signals, such as a word line control signal 316 and a source line control signal 318. A data write path includes the write bit line terminal 308, the conductive layer 310, the free layer 302, the first reference layer 304 the bottom conductor 312, and the switch 314. A data read path includes a bit line read conductor 340, the second reference layer 306, the free layer 302, the first reference layer 304, the bottom conductor 312, and the switch 314.

The free layer 302 includes at least two free layer portions 320 and 322 in both the data write path and the data read path. The free layer 302 also includes a free layer portion 352 in the data read path. Materials in free layer portions 320, 322, and 352 may depend on materials of adjacent layers. For example, from bottom to top, the free layer portions 320, 322, and 352 may include CoFeB/NiFe/CoFeB or CoFeB or CoFe/CoFeB or NiFe/CoFeB or CoFe/NiFe/CoFeB. In a particular embodiment, the conductive layer 310 that abuts the free layer 302 and the write bit line terminal 308 are formed using a conductive material such as Ta, Ru, Cu, Mg, Al, Ti, Au, or any combination thereof.

A first interlayer 324 is positioned between the free layer 302 and the first reference layer 304. In a particular embodiment, to increase write current, the free layer 302 interfacing with the first reference layer 304 can be either a current-perpendicular-to-plane (CPP) giant magnetoresistance (GMR) or a tunneling magnetoresistance (TMR) structure with a very thin MgO barrier. In a particular embodiment, the first interlayer 324 includes an oxidation tunneling barrier, such as MgO or AlOx. In another embodiment, the first interlayer 324 includes a conductive layer, such as Ru, Cu, or Cr.

In a particular embodiment, the first reference layer 304 includes a synthetic antiferromagnet (SAF) structure formed with a CoFeB layer 326, a Ru layer 328, and a CoFe layer 330. The direction of the magnetic field of the SAF is pinned by an antiferromagnetic (AFM) layer 332. The AFM layer 332 is coupled to the bottom conductor 312. In an alternative embodiment, the AFM layer 332 may be coupled to a seed layer or a substrate layer.

In a particular embodiment, the bit line read conductor 340 is a top conductor that also functions as a capping layer of the device 300. In a particular embodiment, the bit line read conductor 340 primarily includes a conductive material, such as Ru, Ta, Cu, Au, Ti, or any combination thereof. The second reference layer 306 includes an AFM layer 342 coupled to the bit line read conductor 340. In a particular embodiment, the AFM layer 342 pins a magnetic moment direction of a second SAF structure formed with a CoFe layer 344, a Ru layer 346, and a CoFeB layer 348. The pinned magnetic moment of the first reference layer 304 is parallel to the pinned magnetic moment of the second reference layer 306.

A second interlayer 350 is positioned between the second reference layer 306 and the free layer 302. In a particular embodiment, the second interlayer 350 is an MgO or AlOx layer providing TMR along the data read path. Resistance across the second interlayer 350 may increase with increased thickness of the second interlayer 350. In a particular embodiment, the second interlayer 350 may be significantly thicker than the first interlayer 324.

Figure 4:
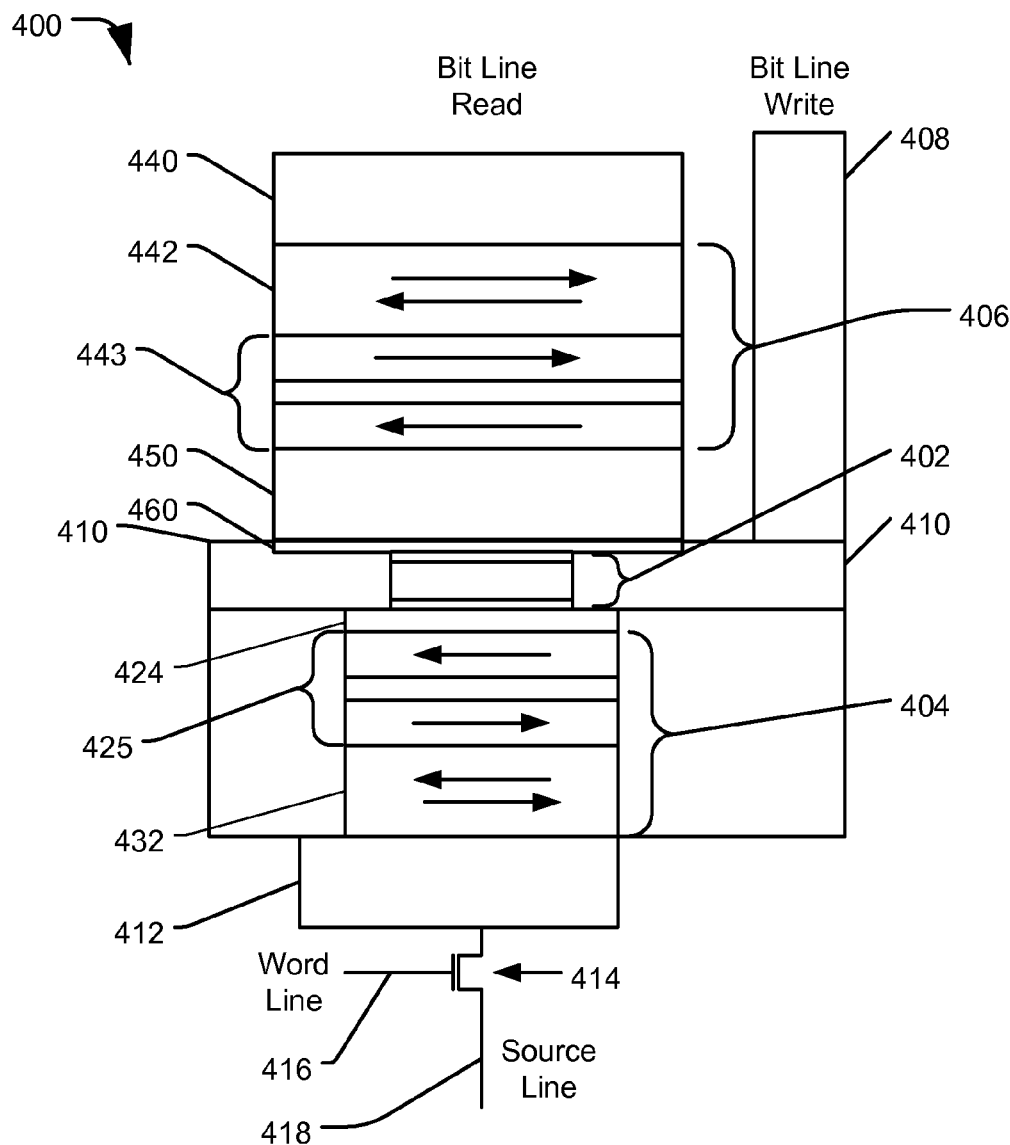
FIG. 4 is a diagram of a fourth illustrative embodiment of a magnetic tunnel junction (MTJ) device with separate data read and write paths.

Referring to FIG. 4, a diagram of a fourth illustrative embodiment of a magnetic tunnel junction (MTJ) device with separate data read and write paths is depicted and generally designated 400. In a particular embodiment, the device 400 may be included in a STT-MRAM bit cell. In a particular embodiment, the device 400 operates substantially similarly to the device 100 illustrated in FIG. 1, the device 200 illustrated in FIG. 2, or the device 300 illustrated in FIG. 3. A free layer 402 is sandwiched between and magnetically coupled to a first reference layer 404 and a second reference layer 406.

A write bit line terminal 408 is coupled to a conductive layer 410 that abuts the free layer 402. A bottom conductor 412 is coupled to the first reference layer 404 and is coupled to a switch 414. The switch 414 is coupled to receive one or more control signals, such as a word line control signal 416 and a source line control signal 418. A data write path includes the write bit line terminal 408, the conductive layer 410, the free layer 402, the first reference layer 404 the bottom conductor 412, and the switch 414. A data read path includes a bit line read conductor 440, the second reference layer 406, the free layer 402, the first reference layer 404, the bottom conductor 412, and the switch 414.

A first interlayer 424 is positioned between the free layer 402 and the first reference layer 404. The first reference layer 404 includes a synthetic antiferromagnet (SAF) structure 425 and an antiferromagnetic (AFM) layer 432. The AFM layer 432 pins a direction of a magnetic moment in the SAF structure 425. The AFM layer 432 is coupled to the bottom conductor 412.

In a particular embodiment, the bit line read conductor 440 is a top conductor that also functions as a capping layer of the device 400. The data read path includes the bit line read conductor 440 coupled to the second reference layer 406. The second reference layer 406 includes a second AFM structure 442 that pins a magnetic moment direction of a SAF layer 443. The pinned magnetic moment of the first reference layer 404 is parallel to the pinned magnetic moment of the second reference layer 406. A second interlayer 450 is coupled to the second reference layer 406.

In a particular embodiment, a thin layer 460 is sandwiched between the second interlayer 450 and the free layer 402. In a particular embodiment, the thin layer 460 is within the read current path but not within the write current path. In a particular embodiment, the thin layer 460 is a thin layer primarily composed of Mg. In an alternative embodiment, the device 400 may not include the thin layer 460.

Figure 5:
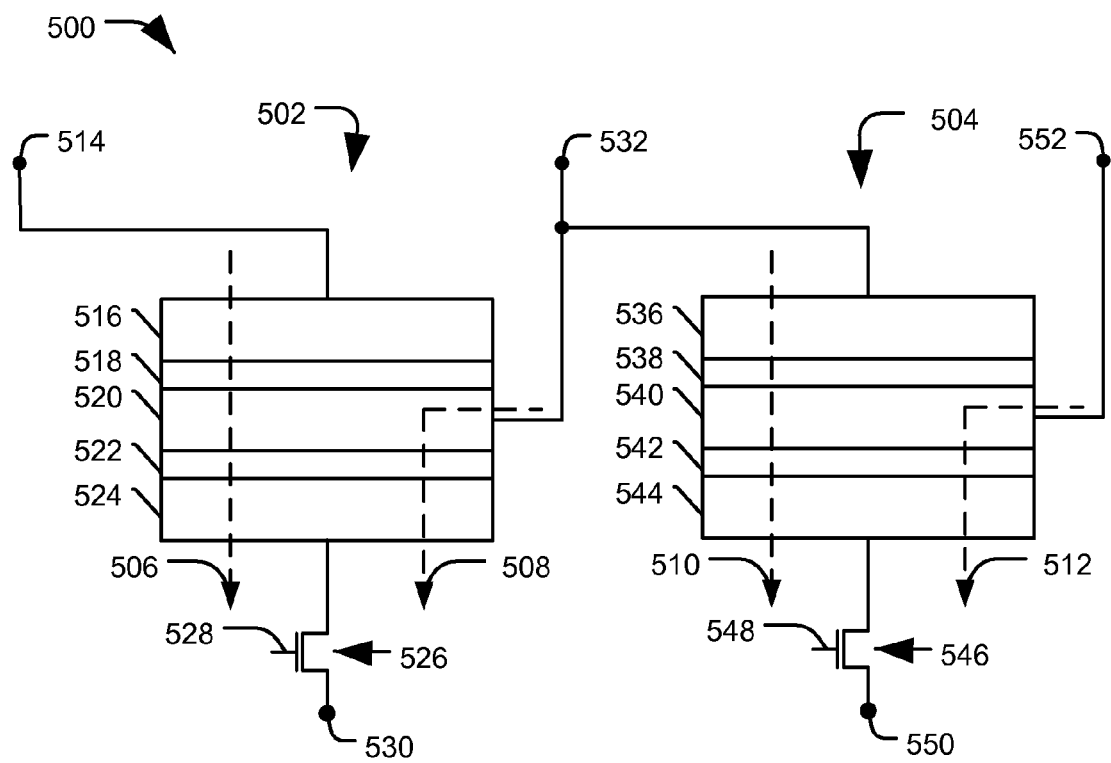
FIG. 5 is a diagram of a particular illustrative embodiment of system including two magnetic tunnel junction (MTJ) devices with separate data read and write paths sharing a common bit line.

Referring to FIG. 5, a diagram of a particular illustrative embodiment of system including two magnetic tunnel junction (MTJ) devices with separate data read and write paths sharing a common bit line is depicted and generally designated 500. The system 500 includes a first MTJ device 502 and a second MTJ device 504. The first MTJ device 502 includes a data read path 506 that is separate from a data write path 508. The second MTJ device 504 includes a data read path 510 that is separate from a data write path 512.

The first MTJ device 502 includes a first reference layer 516, a first interlayer 518, a first free layer 520, a second interlayer 522, and a second reference layer 524. A switch 526 is responsive to a control signal 528 to selectively couple the second reference layer 524 to a source terminal 530. The data read path 506 includes a bit line 514 coupled to the first reference layer 516, the first interlayer 518, the free layer 520, the second interlayer 522, the second reference layer 524, the switch 526, and the source terminal 530. The data write path 508 includes a shared bit line 532 that is coupled to the free layer 520, the second interlayer 522, the second reference layer 524, the switch 526, and the source terminal 530.

In a particular embodiment, the reference layers 516 and 524 each include fixed parallel magnetic moments. The interlayers 518 and 522 may include a tunnel barrier layer. The free layer 520 includes a magnetic moment that may be programmed to be parallel or antiparallel to the magnetic moment of the reference layers 516 and 524. A direction of the magnetic moment of the free layer 520 determines a resistance of the first MTJ device 502 and indicates a data value stored at the first MTJ device 502.

The second MTJ device 504 includes a first reference layer 536, a first interlayer 538, a first free layer 540, a second interlayer 542, and a second reference layer 544. A switch 546 is responsive to a control signal 548 to selectively couple the second reference layer 544 to a source terminal 550. The data read path 510 includes the shared bit line 532 coupled to the first reference layer 536, the first interlayer 538, the free layer 540, the second interlayer 542, the second reference layer 544, the switch 546, and the source terminal 550. The data write path 512 includes a bit line 552 that is coupled to the free layer 540, the second interlayer 542, the second reference layer 544, the switch 546, and the source terminal 550.

In a particular embodiment, the reference layers 536 and 544 each include fixed parallel magnetic moments. The interlayers 538 and 542 may include a tunnel barrier layer. The free layer 540 includes a magnetic moment that may be programmed to be parallel or antiparallel to the magnetic moment of the reference layers 536 and 544. A direction of the magnetic moment of the free layer 540 determines a resistance of the second MTJ device 504 and indicates a data value stored at the second MTJ device 504.

During operation, the shared bit line 532 may be used for a data read operation at the second MTJ device 504, a data write operation at the first MTJ device 502, or both. When a signal is provided on the shared bit line 532, the control signals 528 and 548 determine whether the data write path 508 for the first MTJ device 502 is enabled, or the data read path 510 for the second MTJ device 504 is enabled, or both. A number of bit lines may therefore be reduced when first MTJ device 502 and the second MTJ device 504 are part of an array of MTJ devices.

Figure 6:
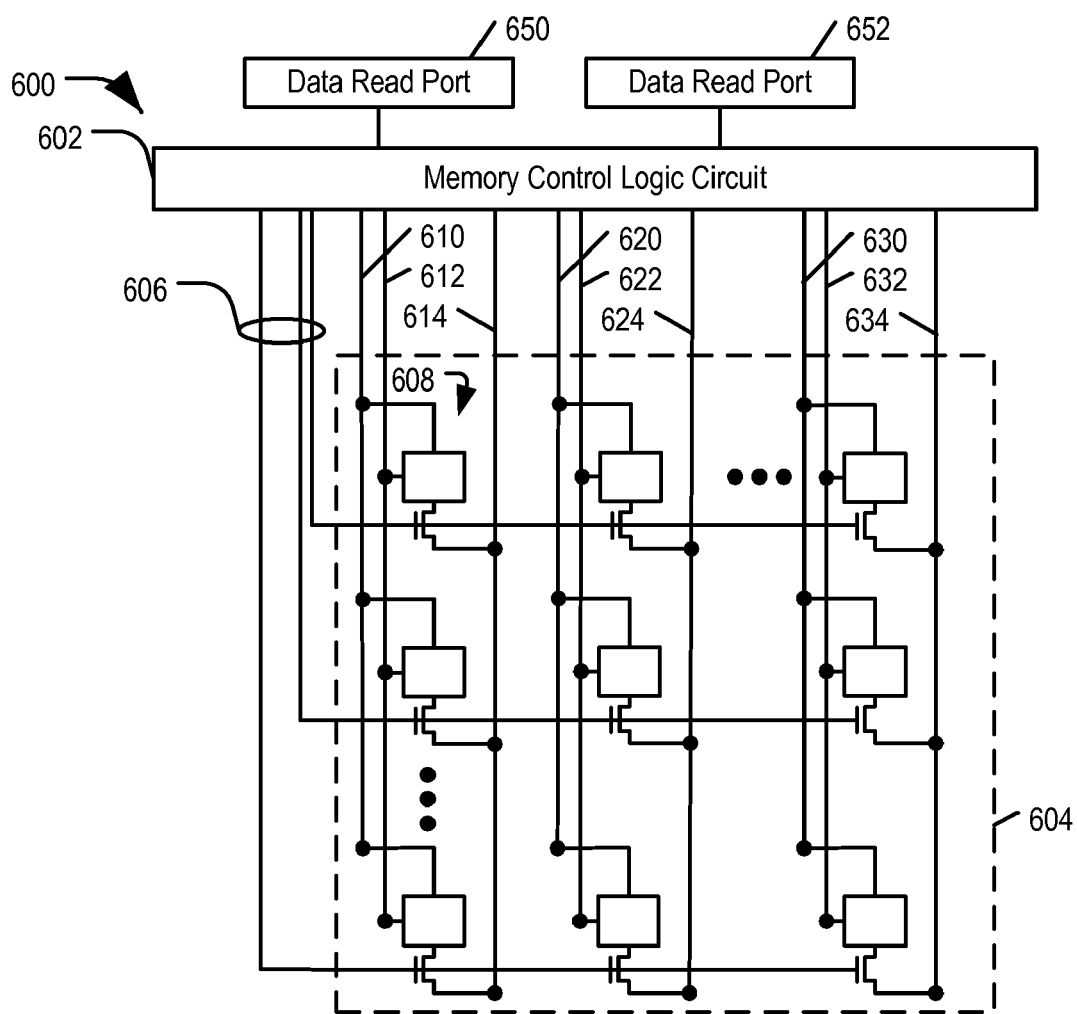
FIG. 6 is a diagram of a first illustrative embodiment of a system including an array of magnetic tunnel junction (MTJ) devices with separate data read and write paths.

Referring to FIG. 6, a diagram of a first illustrative embodiment of a system including an array of magnetic tunnel junction (MTJ) devices with separate data read and write paths is depicted and generally designated 600. The system 600 includes a memory control logic circuit 602 coupled to an array of Magnetic Random Access Memory (MRAM) memory cells 604. Each MRAM memory cell of the array 604, such as a representative cell 608, is configured to operate using separate data read and write paths.

The memory control logic circuit 602 is coupled to select a particular row of the array 604 via a set of word lines 606. The memory control logic circuit 602 is also coupled to select a particular column of the array 604 for reading via read bit lines 610, 620, 630, and for writing via write bit lines 612, 622, 632. Source lines 614, 624, 634 provide a return current path from selected cells of the array 604 to the memory control logic circuit 602. One or more data read ports may be coupled to the array 604, such as a first data read port 650 and a second data read port 652, that are coupled to the array 604 via the memory control logic circuit 602.

In a particular embodiment, the MRAM memory cells of the array 604 may include magnetic tunnel junction (MTJ) devices, such as illustrated in FIGS. 1-4. Each MTJ device may include a first reference layer coupled to a read bit line and a free layer coupled to a write bit line. For example, the representative cell 608 may include a MTJ structure having a first reference layer coupled to the read bit line 610 and a free layer coupled to the write bit line 612. A second reference layer may be coupled to a switch, such as a transistor, having a gate terminal responsive to a respective one of the word lines 606.

A data read path of the representative cell 608 may include the read bit line 610, the first reference layer, a first tunnel barrier between the first reference layer and the free layer, the free layer, a second tunnel barrier between the free layer and the second reference layer, the second reference layer, the switch, and the source line 614. In contrast, a data write path of the representative cell 608 may include the write bit line 612, the free layer, the second tunnel barrier, the second reference layer, the switch, and the source line 614. A resistance of the data read path may be higher than a resistance of the data write path, due at least in part to the additional reference layer and tunnel layer in the data read path.

During operation, the memory control logic circuit 602 may be adapted to activate a word line 606 and to selectively activate a read bit line 610, 620, 630 or a write bit line 612, 622, 632 to access a selected cell of the array 604. A signal may be applied to the selected bit line and a resultant output may be compared to a reference to determine a data value stored at the selected cell. For example, the memory control logic circuit 602 may perform a read operation at the representative cell 608 by applying a voltage between the read line 610 and the source line 614, and the resulting current through the read line 610 or the source line 614 may be compared to a reference current, such as via a current sense amplifier. As another example, a current may be applied to the read line 610, and a resulting voltage between the read line 610 and the source line 614 may be compared to a reference voltage, such as via a voltage sense amplifier. The data value determined from the read operation may be provided via the first data read port 650 or the second data read port 652.

Figure 7:
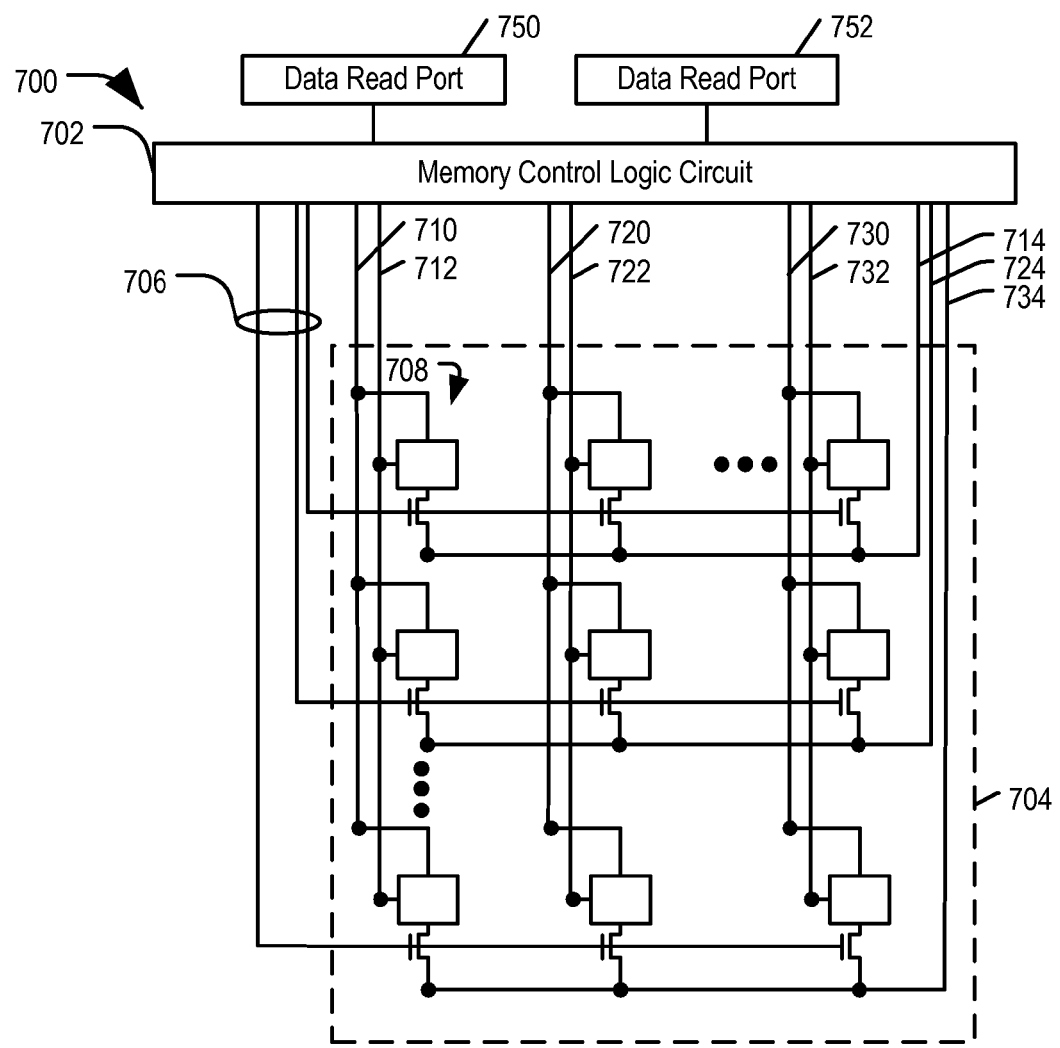
FIG. 7 is a diagram of a second illustrative embodiment of a system including an array of magnetic tunnel junction (MTJ) devices with separate data read and write paths.

Referring to FIG. 7, a diagram of a second illustrative embodiment of a system including an array of magnetic tunnel junction (MTJ) devices with separate data read and write paths is depicted and generally designated 700. The system 700 includes a memory control logic circuit 702 coupled to an array of Magnetic Random Access Memory (MRAM) memory cells 704. Each MRAM memory cell of the array 704, such as a representative cell 708, is configured to operate using separate data read and write paths.

The memory control logic circuit 702 is coupled to select a particular row of the array 704 via a set of word lines 706. The memory control logic circuit 702 is also coupled to select a particular column of the array 704 for reading via read bit lines 710, 720, 730, and for writing via write bit lines 712, 722, 732. Source lines 714, 724, 734 provide a return current path from selected cells of the array 704 to the memory control logic circuit 702. The memory cells of each row of the array 704 share a respective source line 714, 724, or 734. One or more data read ports may be coupled to the array 704, such as a first data read port 750 and a second data read port 752, that are coupled to the array 704 via the memory control logic circuit 702.

In a particular embodiment, the MRAM memory cells of the array 704 may include magnetic tunnel junction (MTJ) devices, such as illustrated in FIGS. 1-4. Each MTJ device may include a first reference layer coupled to a read bit line and a free layer coupled to a write bit line. For example, the representative cell 708 may include a MTJ structure having a first reference layer coupled to the read bit line 710 and a free layer coupled to the write bit line 712. A second reference layer may be coupled to a switch, such as a transistor, having a gate terminal responsive to a respective one of the word lines 706.

A data read path of the representative cell 708 may include the read bit line 710, the first reference layer, a first tunnel barrier between the first reference layer and the free layer, the free layer, a second tunnel barrier between the free layer and the second reference layer, the second reference layer, the switch, and the source line 714. In contrast, a data write path of the representative cell 708 may include the write bit line 712, the free layer, the second tunnel barrier, the second reference layer, the switch, and the source line 714. A resistance of the data read path may be higher than a resistance of the data write path, due at least in part to the additional reference layer and tunnel layer in the data read path.

During operation, the memory control logic circuit 702 may be adapted to activate a word line 706 and to selectively activate a read bit line 710, 720, 730 or a write bit line 712, 722, 732 to access a selected cell of the array 704. A signal may be applied to the selected bit line and a resultant output may be compared to a reference to determine a data value stored at the selected cell. For example, the memory control logic circuit 702 may perform a read operation at the representative cell 708 by applying a voltage between the read line 710 and the source line 714, and the resulting current through the read line 710 or the source line 714 may be compared to a reference current, such as via a current sense amplifier. As another example, a current may be applied to the read line 710, and a resulting voltage between the read line 710 and the source line 714 may be compared to a reference voltage, such as via a voltage sense amplifier. The data value determined from the read operation may be provided via the first data read port 750 or the second data read port 752.

Figure 8:
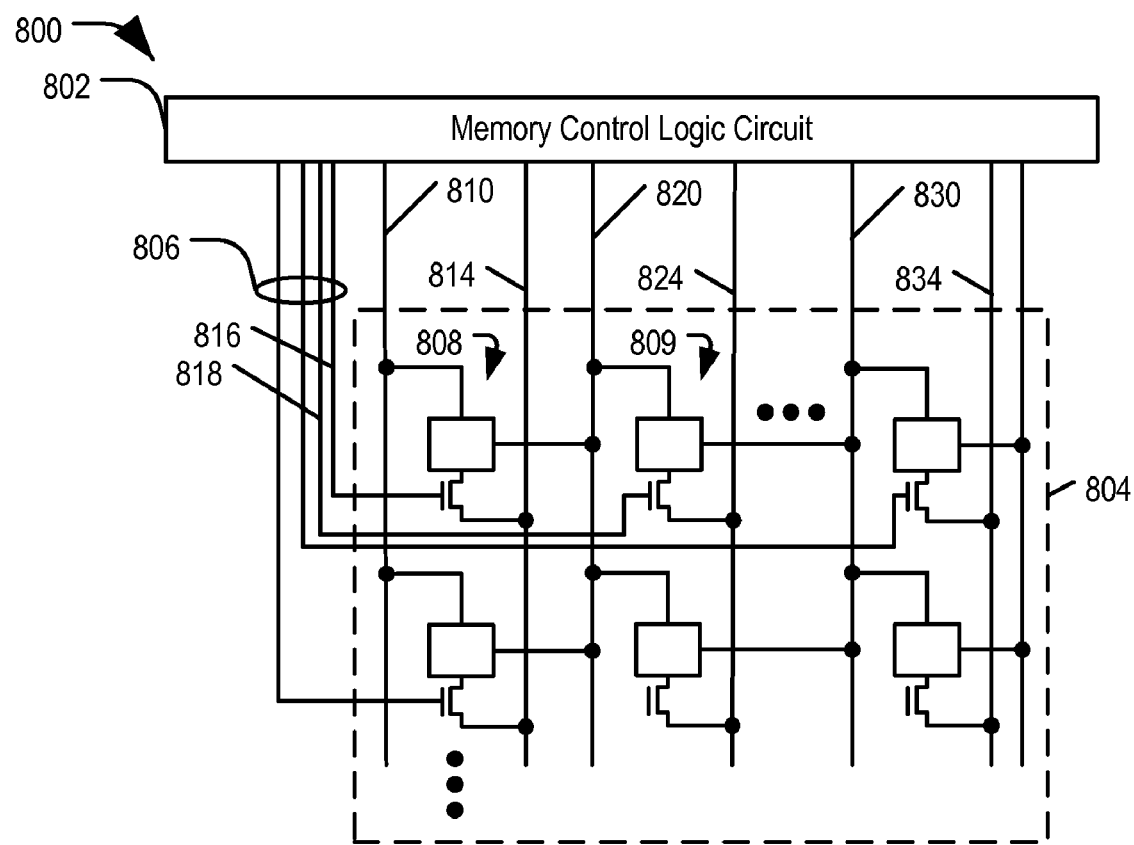
FIG. 8 is a diagram of a first illustrative embodiment of a system including an array of magnetic tunnel junction (MTJ) devices with separate data read and write paths sharing common bit lines.

Referring to FIG. 8, a diagram of a first illustrative embodiment of a system including an array of magnetic tunnel junction (MTJ) devices with separate read and write paths sharing common bit lines is depicted and generally designated 800. The system 800 includes a memory control logic circuit 802 coupled to an array of Magnetic Random Access Memory (MRAM) memory cells 804. Each MRAM memory cell of the array 804, such as a first representative cell 808 and a second representative cell 809, is configured to operate using separate data read and write paths and to share common bit lines.

The memory control logic circuit 802 is coupled to select a particular row of the array 804 via a set of word lines 806. The memory control logic circuit 802 is coupled to select a particular column of the array 804 for reading and writing via bit lines 810, 820, 830. Source lines 814, 824, 834 provide a return current path from selected cells of the array 804 to the memory control logic circuit 802.

In a particular embodiment, the MRAM memory cells of the array 804 may include magnetic tunnel junction (MTJ) devices, such as illustrated in FIGS. 1-5. Each MTJ device may include a first reference layer coupled to a read bit line and a free layer coupled to a write bit line. For example, the representative cell 808 may include a MTJ structure having a first reference layer coupled to the bit line 810 and a free layer coupled to the bit line 820. A second reference layer may be coupled to a switch, such as a transistor, having a gate terminal responsive to a respective one of the word lines 806.

The data read path of the first representative cell 808 may include the bit line 810, the first reference layer, a first tunnel barrier between the first reference layer and the free layer, the free layer, a second tunnel barrier between the free layer and the second reference layer, the second reference layer, the switch, and the source line 814. In contrast, a data write path of the representative cell 808 may include the bit line 820, the free layer, the second tunnel barrier, the second reference layer, the switch, and the source line 814. A resistance of the data read path may be higher than a resistance of the data write path, due at least in part by the additional reference layer and tunnel layer in the data read path.

The data read path of the second representative cell 809 may include the bit line 820 which is shared with the data write path of the first representative cell 808. The data read path of the second representative cell 809 may also include the first reference layer, a first tunnel barrier between the first reference layer and the free layer, the free layer, a second tunnel barrier between the free layer and the second reference layer, the second reference layer, the switch, and the source line 824. A data write path of the second representative cell 809 may include the bit line 830, the free layer, the second tunnel barrier, the second reference layer, the switch, and the source line 824. A resistance of the data read path may be higher than a resistance of the data write path, due at least in part by the additional reference layer and tunnel layer in the data read path.

During operation, the memory control logic circuit 802 may be adapted to activate a bit line 810, 820, 830 and to selectively activate a read word line or a write word line to access a selected cell of the array 804. For example the memory control logic circuit 802 may activate the shared bit line 820 and may activate a first word line 816 coupled to the first representative cell 808 to write to the first representative cell 808. In addition, the memory control logic 802 may activate the shared bit line 820 and may activate a second word line 818 coupled to the second representative cell 809 to read from the second representative cell 809. Further, because the adjacent cells 808 and 809 sharing the common bit line 820 are coupled to separate source lines 814 and 824, read and write operations may be conducted concurrently at the cells 808 and 809 using the common bit line 820. Thus, a read operation, a write operation, or both, may be performed using the same bit line shared by adjacent cells.

Figure 9:
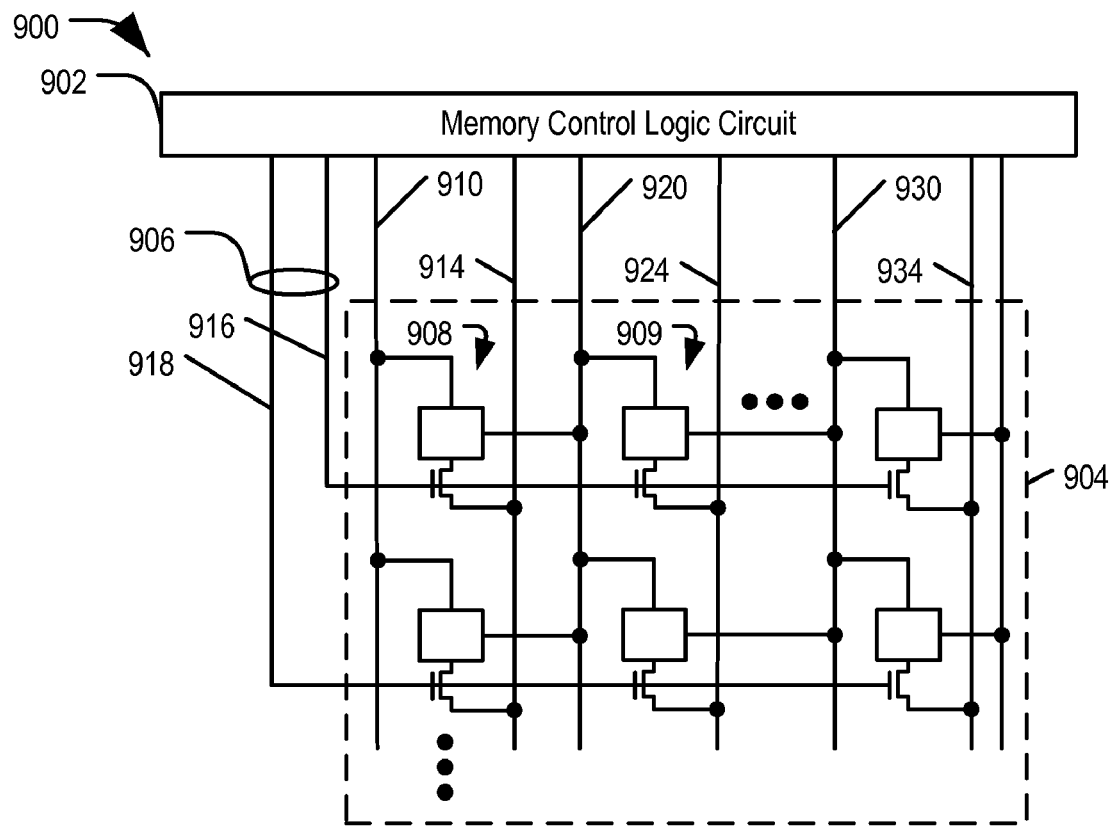
FIG. 9 is a diagram of a second illustrative embodiment of a system including an array of magnetic tunnel junction (MTJ) devices with separate data read and write paths sharing common bit lines.

Referring to FIG. 9, a diagram of a second illustrative embodiment of a system including an array of magnetic tunnel junction (MTJ) devices with separate read and write paths sharing common bit lines is depicted and generally designated 900. The system 900 includes a memory control logic circuit 902 coupled to an array of Magnetic Random Access Memory (MRAM) memory cells 904. Each MRAM memory cell of the array 904, such as a first representative cell 908 and a second representative cell 909, is configured to operate using separate data read and write paths and to share common bit lines.

The memory control logic circuit 902 is coupled to select a particular row of the array 904 via a set of word lines 906. The memory control logic circuit 902 is coupled to select a particular column of the array 904 for reading and writing via bit lines 910, 920, 930. Source lines 914, 924, 934 provide a return current path from selected cells of the array 904 to the memory control logic circuit 902.

In a particular embodiment, the MRAM memory cells of the array 904 may include magnetic tunnel junction (MTJ) devices, such as illustrated in FIGS. 1-5. Each MTJ device may include a first reference layer coupled to a read bit line and a free layer coupled to a write bit line. For example, the representative cell 908 may include a MTJ structure having a first reference layer coupled to the bit line 910 and a free layer coupled to the bit line 920. A second reference layer may be coupled to a switch, such as a transistor, having a gate terminal responsive to a respective one of the word lines 906.

The data read path of the first representative cell 908 may include the bit line 910, the first reference layer, a first tunnel barrier between the first reference layer and the free layer, the free layer, a second tunnel barrier between the free layer and the second reference layer, the second reference layer, the switch, and the source line 914. In contrast, a data write path of the representative cell 908 may include the bit line 920, the free layer, the second tunnel barrier, the second reference layer, the switch, and the source line 914. A resistance of the data read path may be higher than a resistance of the data write path, due at least in part by the additional reference layer and tunnel layer in the data read path.

The data read path of the second representative cell 909 may include the bit line 920 which is shared with the data write path of the first representative cell 908. The data read path of the second representative cell 909 may also include the first reference layer, a first tunnel barrier between the first reference layer and the free layer, the free layer, a second tunnel barrier between the free layer and the second reference layer, the second reference layer, the switch, and the source line 924. A data write path of the second representative cell 909 may include the bit line 930, the free layer, the second tunnel barrier, the second reference layer, the switch, and the source line 924. A resistance of the data read path may be higher than a resistance of the data write path, due at least in part by the additional reference layer and tunnel layer in the data read path.

During operation, the memory control logic circuit 902 may be adapted to activate a bit line 910, 920, 930, a word line 906, and a source line 914, 924, 934 to selectively activate a cell of the array 904 for a read or write operation. For example the memory control logic circuit 902 may activate the shared bit line 920 and may activate a first word line 916 coupled to the first representative cell 908 and the second representative cell 909. The memory control logic circuit 902 may activate the source line 914 to perform a write operation at the first representative cell 908 or the source line 924 to perform a read operation at the second representative cell 909.

Figure 10:
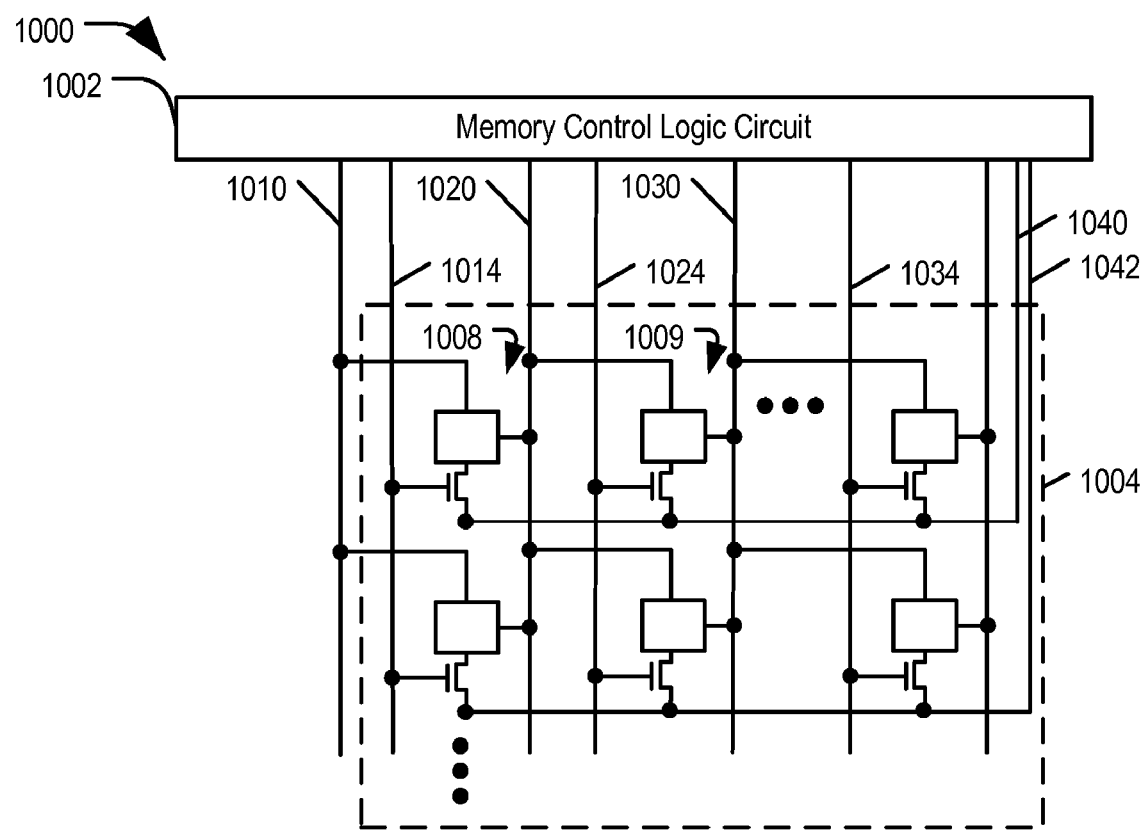
FIG. 10 is a diagram of a third illustrative embodiment of a system including an array of magnetic tunnel junction (MTJ) devices with separate data read and write paths sharing common bit lines.

Referring to FIG. 10, a diagram of a third illustrative embodiment of a system including an array of magnetic tunnel junction (MTJ) devices with separate read and write paths sharing common bit lines is depicted and generally designated 1000. The system 1000 includes a memory control logic circuit 1002 coupled to an array of Magnetic Random Access Memory (MRAM) memory cells 1004. Each MRAM memory cell of the array 1004, such as a first representative cell 1008 and a second representative cell 1009, is configured to operate using separate data read and write paths and to share common bit lines.

The memory control logic circuit 1002 is coupled to select a particular column of the array 1004 via a set of word lines 1014, 1024, 1034. The memory control logic circuit 1002 is coupled to select a particular row of the array 1004 via source lines 1040, 1042. The memory control logic circuit 1002 is coupled to select bit lines 1010, 1020, 1030 to determine a read operation or a write operation at a selected cells of the array 1004.

In a particular embodiment, the MRAM memory cells of the array 1004 may include magnetic tunnel junction (MTJ) devices, such as illustrated in FIGS. 1-5. Each MTJ device may include a first reference layer coupled to a read bit line and a free layer coupled to a write bit line. For example, the representative cell 1008 may include a MTJ structure having a first reference layer coupled to the bit line 1010 and a free layer coupled to the bit line 1020. A second reference layer may be coupled to a switch, such as a transistor, having a gate terminal responsive to the word line 1014.

The data read path of the first representative cell 1008 may include the bit line 1010, the first reference layer, a first tunnel barrier between the first reference layer and the free layer, the free layer, a second tunnel barrier between the free layer and the second reference layer, the second reference layer, the switch, and the source line 1040. In contrast, a data write path of the representative cell 1008 may include the bit line 1020, the free layer, the second tunnel barrier, the second reference layer, the switch, and the source line 1040. A resistance of the data read path may be higher than a resistance of the data write path, due at least in part by the additional reference layer and tunnel layer in the data read path.

The data read path of the second representative cell 1009 may include the bit line 1020 which is shared with the data write path of the first representative cell 1008. The data read path of the second representative cell 1009 may also include the first reference layer, a first tunnel barrier between the first reference layer and the free layer, the free layer, a second tunnel barrier between the free layer and the second reference layer, the second reference layer, the switch, and the source line 1040. A data write path of the second representative cell 1009 may include the bit line 1030, the free layer, the second tunnel barrier, the second reference layer, the switch, and the source line 1040. A resistance of the data read path may be higher than a resistance of the data write path, due at least in part by the additional reference layer and tunnel layer in the data read path.

During operation, the memory control logic circuit 1002 may be adapted to activate a bit line 1010, 1020, 1030, a word line 1014, 1024, 1034, and a source line 1040, 1042 to selectively activate a cell of the array 1004 for reading or writing operations. For example the memory control logic circuit 1002 may activate the shared bit line 1020, the word line 1014, and the source line 1040 to write to the first representative cell 1008. With the shared bit line 1020 and the source line 1040 activated, the memory control logic 102 may deactivate the word line 1014 and activate the word line 1024 to read from the second representative cell 1009. As used herein, the term "source line" is used to designate a line coupled to a switching terminal of a switch (e.g., a source terminal of a field effect transistor), and "word line" is used to designate a line coupled to a control terminal of a switch (e.g., a gate of a field effect transistor) for consistency with other disclosed embodiments, even though in the embodiment illustrated in FIG. 10 each word line 1014, 1024, 1034 designates a respective column of the array 1004, and each source line 1040, 1042 designates a respective row of the array 1004.

Figure 11:
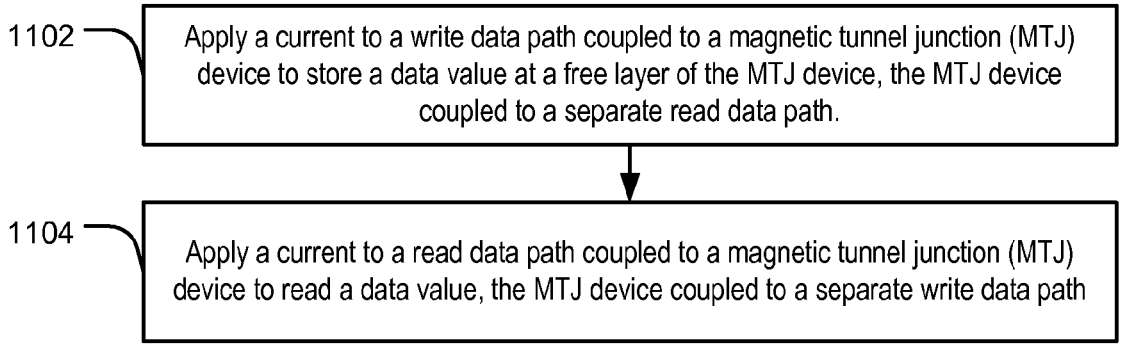
FIG. 11 is a flow diagram of a particular illustrative embodiment of a method of operating a magnetic tunnel junction (MTJ) device.

Referring to FIG. 11, a flow diagram of a particular illustrative embodiment of a method of operating a magnetic tunnel junction (MTJ) device is depicted. At 1102, a write operation is performed by applying current to a data write path coupled to a magnetic tunnel junction (MTJ) device to store a data value at a free layer of the MTJ device. The MTJ device is coupled to a separate data read path. In a particular embodiment, the data write path has a lower resistance than the data read path. In an illustrative embodiment, the data write path includes one reference layer, and the data read path includes two reference layers. In a particular embodiment, the MTJ device may be in an array of MTJ devices controlled by a memory control logic circuit, such as illustrated in FIGS. 6-10.

Continuing to 1104, a read operation is performed by applying current to a data read path coupled to a magnetic tunnel junction (MTJ) device to read a data value. The MTJ device is coupled to a separate data write path. In a particular embodiment, the read and write operations may be performed concurrently at separate MTJ devices. In a particular embodiment, the read and write operations may be performed consecutively at the same MTJ device. In a particular embodiment, the MTJ device includes a free layer to store the data value and includes a reference layer that is magnetically coupled to the free layer, and the data read path includes a second reference layer. In a particular embodiment, the MTJ device includes two MTJ structures that are magnetically coupled to each other, such as the MTJ components 106 and 108 illustrated in FIG. 1.

Figure 12:
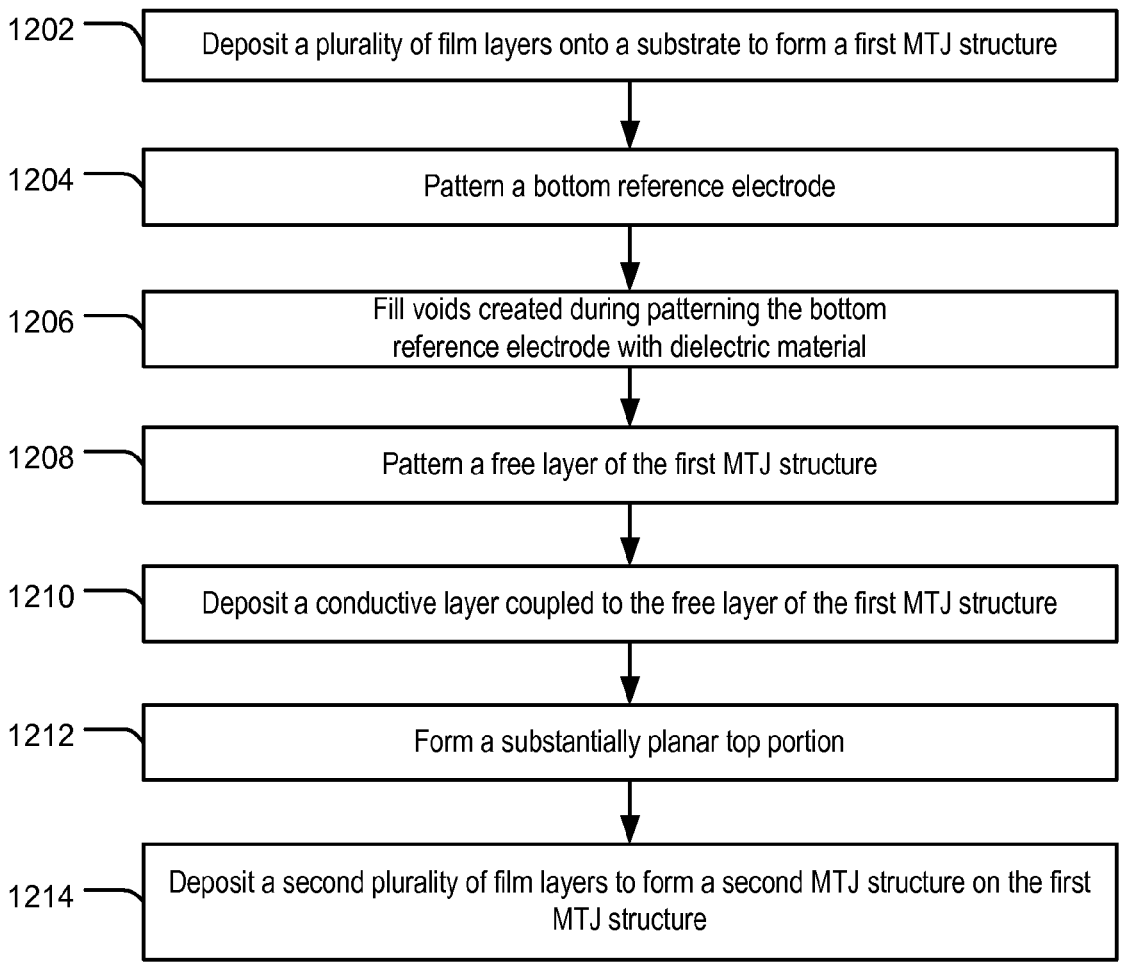
FIG. 12 is a flow diagram of a particular illustrative embodiment of a method of fabricating a magnetic tunnel junction (MTJ) device.
Figure 13:
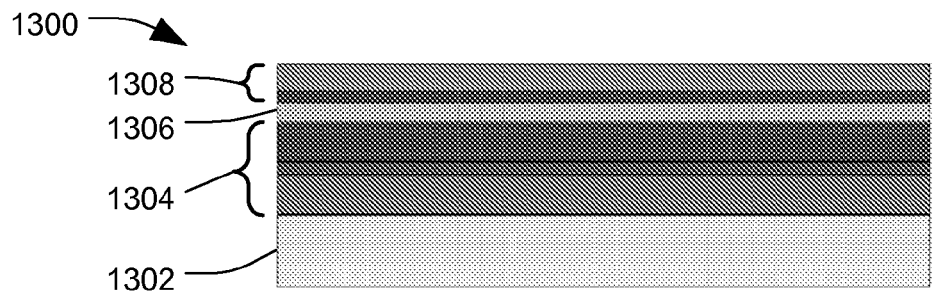
FIGS. 13-19 illustrate a particular illustrative embodiment of fabrication stages of the method of FIG. 12.

Referring to FIG. 12, a flow diagram of a particular illustrative embodiment of a method of fabricating a magnetic tunnel junction (MTJ) device is depicted. In a particular embodiment, the method may be used to fabricate a MTJ device having separate read and write paths, such as illustrated in FIGS. 1-4. At 1202, film layers are deposited onto a substrate to form a first MTJ structure. An illustrative, non-limiting example 1300 is depicted in FIG. 13 and includes an antiferromagnetic (AFM) layer 1302, a synthetic antiferromagnet (SAF) layer 1304, an interlayer 1306, and a free layer 1308. For example, the SAF layer 1304 may include CoFe/Ru/CoFeB sub-layers. The interlayer 1306 may be a tunnel barrier layer, such as MgO or AlOx, or a conductive layer, such as Cu or Ru. The free layer 1308 may include CoFeB/NiFe/CoFeB or CoFeB or CoFe/CoFeB or NiFe/CoFeB or CoFe/NiFe/CoFeB sub-layers, as illustrative, non-limiting examples.

Figure 14:
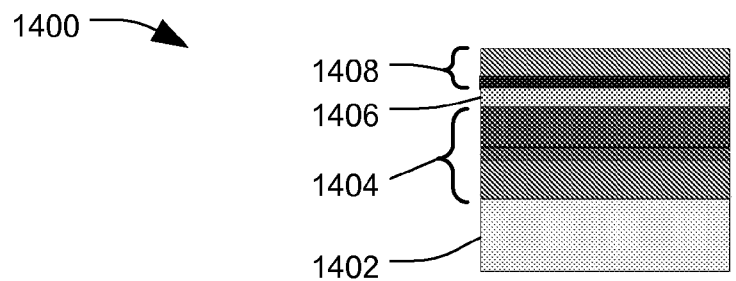

Continuing to 1204, in a particular embodiment, a bottom reference electrode is patterned. An illustrative, non-limiting example of a patterned bottom electrode 1400 is depicted in FIG. 14. The patterned bottom electrode 1400 includes a patterned AFM layer 1402, a patterned SAF layer 1404, a patterned tunnel barrier layer 1406, and a patterned free layer 1408.

Figure 15:
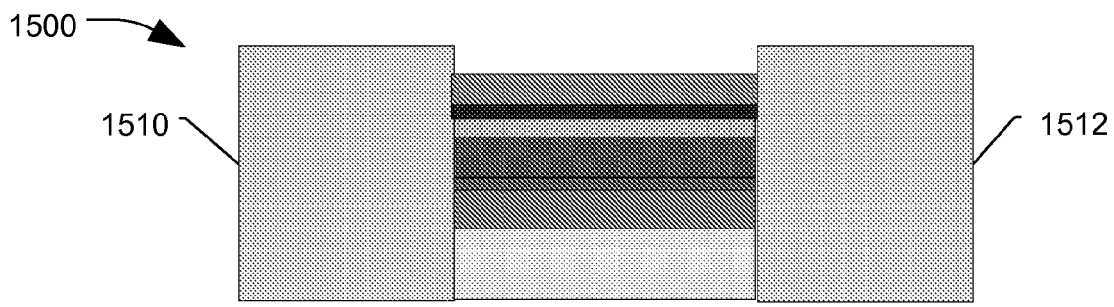

Moving to 1206, in a particular embodiment, voids that are created in the first MTJ structure during patterning the bottom reference electrode are filled with a dielectric material, such as silicon nitride. An illustrative, non-limiting example 1500 is depicted in FIG. 15, illustrating SiNx or other dielectric material 1510 and 1512 filling voids created during patterning of a bottom electrode.

Figure 16:
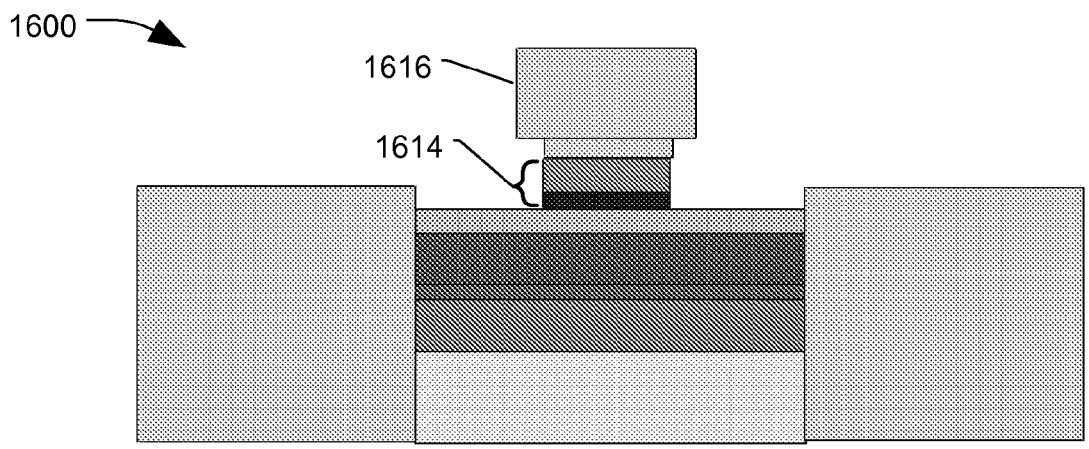

Advancing to 1208, in a particular embodiment, a free layer of the first MTJ structure is patterned. An illustrative, non-limiting example 1600 is depicted in FIG. 16, illustrating a patterned free layer 1614 after application of photoresist 1616 and an etching process.

Figure 17:
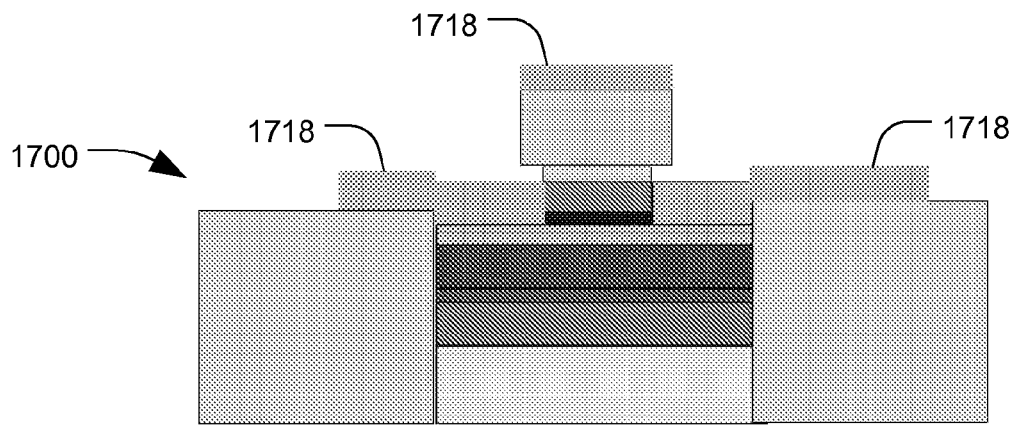

Proceeding to 1210, a conductive layer is deposited that is coupled to the free layer of the first MTJ structure. In a particular embodiment, the conductive layer abuts at least one wall of the free layer. An illustrative, non-limiting example 1700 is depicted in FIG. 17, illustrating depositing of a conductive layer 1718 that abuts a patterned free layer of an MTJ structure. As an illustrative example, the conductive layer 1718 may be Cu, Ru, Ta, Mg, Al, other conductive materials, or any combination thereof.

Figure 18:
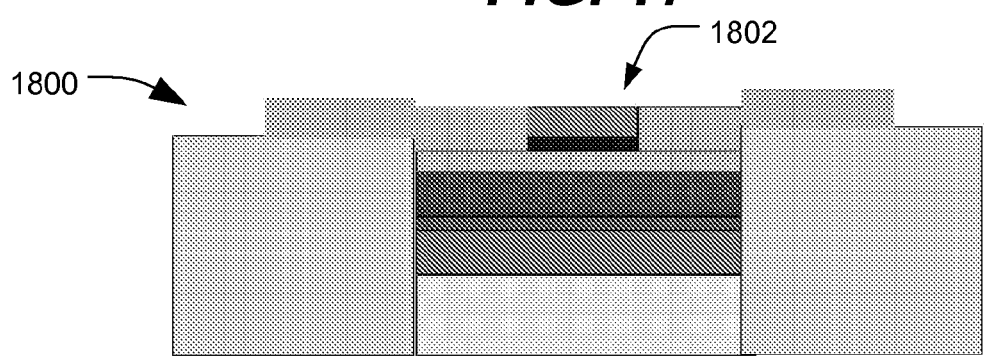

Continuing to 1212, in a particular embodiment, a substantially planar top portion is formed. For example, forming the substantially planar top portion may include removing photoresist that was deposited while patterning the free layer. An illustrative, non-limiting example 1800 is depicted in FIG. 18, illustrating a substantially planar top portion 1802.

Figure 19:
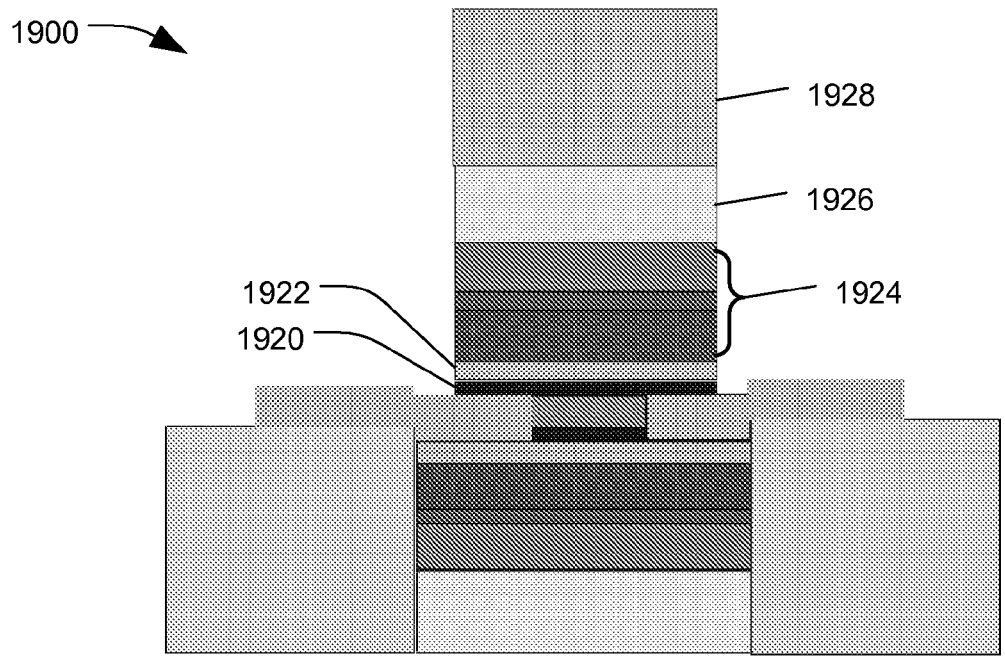

Moving to 1214, a second set of film layers are deposited to form a second MTJ structure on the first MTJ structure. An illustrative, non-limiting example 1900 is depicted in FIG. 19, illustrating a free layer portion 1920, a tunnel barrier layer 1922, a SAF layer 1924, an AFM layer 1926, and a top conductive layer 1928. As an illustrative example, the free layer portion 1920 may include one or more of the sub-layers 1308 illustrated in FIG. 13. As an alternative embodiment, the set of film layers may not include the free layer portion 1920. The tunnel barrier layer 1922 may include a thick MgO or AlOx layer to increase a read resistance of the device. The SAF layer 1924 may include CoFe/Ru/CoFeB sub-layers. The top conductive layer 1928 may include Cu, Ru, Ta, Mg, Al, other conductive materials, or any combination thereof. In a particular embodiment, a read line is coupled to the second MTJ structure and a write line is coupled to the conductive layer.

Figure 20:
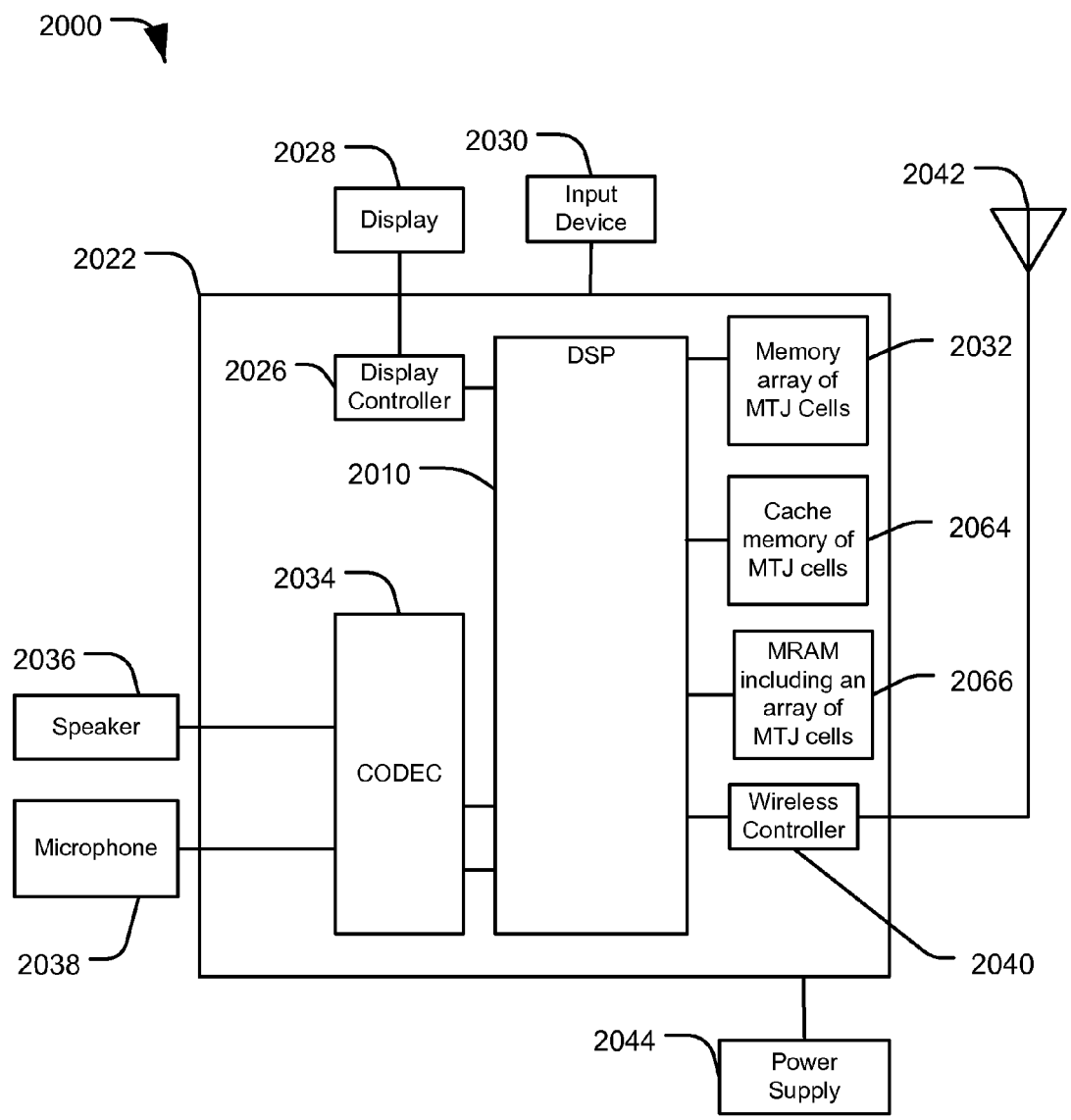
FIG. 20 is a block diagram of a communications device including a memory device that includes multiple magnetic tunnel junction (MTJ) cells.

FIG. 20 is a block diagram of a communications device 2000 including a memory device that includes multiple magnetic tunnel junction (MTJ) cells. The communications device 2000 includes a memory array of MTJ cells 2032 and a cache memory of MTJ cells 2064, which are coupled to a processor, such as a digital signal processor (DSP) 2010. The communications device 2000 also includes a magnetoresistive random access memory (MRAM) device 2066 that is coupled to the DSP 2010. In a particular example, the memory array of MTJ cells 2032, the cache memory of MTJ cells 2064, and the MRAM device 2066 include multiple MTJ cells, where each MTJ cell includes separate read and write paths, as described with respect to FIGS. 1-16.

FIG. 20 also shows a display controller 2026 that is coupled to the digital signal processor 2010 and to a display 2028. A coder/decoder (CODEC) 2034 can also be coupled to the digital signal processor 2010. A speaker 2036 and a microphone 2038 can be coupled to the CODEC 2034.

FIG. 20 also indicates that a wireless controller 2040 can be coupled to the digital signal processor 2010 and to a wireless antenna 2042. In a particular embodiment, an input device 2030 and a power supply 2044 are coupled to the on-chip system 2022. Moreover, in a particular embodiment, as illustrated in FIG. 20, the display 2028, the input device 2030, the speaker 2036, the microphone 2038, the wireless antenna 2042, and the power supply 2044 are external to the on-chip system 2022. However, each can be coupled to a component of the on-chip system 2022, such as an interface or a controller.

Those of skill would further appreciate that the various illustrative logical blocks, configurations, modules, circuits, and algorithm steps described in connection with the embodiments disclosed herein may be implemented as electronic hardware, computer software, or combinations of both. To clearly illustrate this interchangeability of hardware and software, various illustrative components, blocks, configurations, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in RAM memory, flash memory, ROM memory, PROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a computing device or a user terminal. In the alternative, the processor and the storage medium may reside as discrete components in a computing device or user terminal.

The previous description of the disclosed embodiments is provided to enable any person skilled in the art to make or use the disclosed embodiments. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope possible consistent with the principles and novel features as defined by the following claims.

What is claimed is:

1. A device comprising:
   a magnetic tunnel junction (MTJ) structure, wherein the MTJ structure includes a single free layer, a first tunnel barrier, a second tunnel barrier, a first reference layer, and a second reference layer;
   a read path coupled to the MTJ structure, wherein the read path includes the first reference layer, the second reference layer, the first tunnel barrier, the second tunnel barrier, and the free layer; and
   a write path coupled to the MTJ structure, wherein the write path is separate from the read path, wherein the write path includes the first reference layer, the first tunnel barrier, and the free layer, and wherein the write path abuts the free layer at a side of the free layer.

2. The device of claim 1, wherein the read path has a higher resistance than the write path.

3. The device of claim 1, wherein the first tunnel barrier has a lower resistance than the second tunnel barrier.

4. The device of claim 1, wherein the MTJ structure comprises a first MTJ component coupled to a second MTJ component, wherein the read path comprises the first MTJ component and the second MTJ component and wherein the write path comprises the second MTJ component but not the first MTJ component.

5. The device of claim 4, wherein the second MTJ component is coupled to the first MTJ component.

6. The device of claim 1, wherein the read path and the write path further include an interlayer, a first synthetic antiferromagnet (SAF) layer, and a first antiferromagnetic (AFM) layer.

7. The device of claim 6, wherein the read path includes a second SAF layer and a second AFM layer.

8. The device of claim 7, wherein the first SAF layer and the second SAF layer include a cobalt iron boron (CoFeB) layer, a rhodium (Ru) layer, and a cobalt iron (CoFe) layer, and wherein the write path includes a conductive layer that abuts the free layer.

9. The device of claim 1, wherein the MTJ structure is coupled to a switch and wherein each of the read path and the write path further include the switch.

10. The device of claim 9, wherein the switch receives a word line control signal, a source line control signal, or any combination thereof.

\* \* \* \* \*